United States Patent
Rogers et al.

(10) Patent No.: US 10,043,720 B2
(45) Date of Patent: Aug. 7, 2018

(54) SYSTEMS AND METHODS FOR INTERCONNECT SIMULATION AND CHARACTERIZATION

(71) Applicants: Blake Rogers, Mesa, AZ (US); Amaneh Tasooji, Tempe, AZ (US)

(72) Inventors: Blake Rogers, Mesa, AZ (US); Amaneh Tasooji, Tempe, AZ (US)

(73) Assignee: Arizona Board of Regents, Scottsdale, AZ (US)

( * ) Notice: Subject to any disclaimer, the term of this patent is extended or adjusted under 35 U.S.C. 154(b) by 0 days.

(21) Appl. No.: 15/367,318

(22) Filed: Dec. 2, 2016

(65) Prior Publication Data

US 2017/0162454 A1 Jun. 8, 2017

Related U.S. Application Data

(60) Provisional application No. 62/261,965, filed on Dec. 2, 2015.

(51) Int. Cl.
| | |
|---|---|
| H01L 21/28 | (2006.01) |
| H01L 21/66 | (2006.01) |
| H01L 23/00 | (2006.01) |
| G01R 31/28 | (2006.01) |

(52) U.S. Cl.
CPC ......... *H01L 22/12* (2013.01); *G01R 31/2858* (2013.01); *H01L 24/11* (2013.01); *H01L 24/81* (2013.01); *H01L 2224/1111* (2013.01); *H01L 2224/11848* (2013.01); *H01L 2224/81024* (2013.01); *H01L 2224/81801* (2013.01)

(58) Field of Classification Search
CPC .. G02B 6/3652; G02B 6/3636; G02B 6/3897; G02B 6/423; H01L 21/67775
See application file for complete search history.

(56) References Cited

U.S. PATENT DOCUMENTS

| | | |
|---|---|---|
| 5,436,567 A | 7/1995 | Wexler |
| 6,762,613 B1 | 7/2004 | Yao |
| 6,856,157 B2 | 2/2005 | Martter et al. |
| 7,215,736 B1 | 5/2007 | Wang |
| 8,237,458 B2 | 8/2012 | Federspiel |
| 2006/0033515 A1 | 2/2006 | Haba |
| 2008/0278584 A1* | 11/2008 | Shih ........................ G06T 7/215 348/169 |
| 2011/0037477 A1 | 2/2011 | Hein |
| 2012/0268147 A1* | 10/2012 | Chen .................... G01R 31/048 324/713 |

(Continued)

OTHER PUBLICATIONS

Teramoto et al., "Automated Solder Inspection Technique for BGA-Mounted Substrates by Means of Oblique Computed Tomography," IEEE Transactions on Electronics Packaging Manufacturing, vol. 30, No. 4, pp. 285-292, 2007.

(Continued)

*Primary Examiner* — Jaehwan Oh
(74) *Attorney, Agent, or Firm* — Snell & Wilmer L.L.P.

(57) ABSTRACT

Exemplary systems and methods allow for precise formation and subsequent characterization of electrical interconnects, for example solder joints associated with integrated circuit packages. The system may utilize a cartridge-like structure for use in aligning the metal components to be interconnected, and to facilitate subsequent testing of the interconnect.

17 Claims, 12 Drawing Sheets

(56) References Cited

U.S. PATENT DOCUMENTS

| | | | |
|---|---|---|---|
| 2013/0168851 A1* | 7/2013 | Lin | H01L 24/11 257/737 |
| 2014/0232428 A1 | 8/2014 | Chen | |
| 2015/0160354 A1 | 6/2015 | Mertens | |

OTHER PUBLICATIONS

Dudek et al., "Three-Dimensional (3D) Visualization of Reflow Porosity and Modeling of Deformation in Pb-Free Solder Joints," Materials Characterization, vol. 61, Issue 4, pp. 433-439, 2010.

Jiang et al., "Three-Dimensional (3D) Microstructural Characterization and Quantification of Reflow Porosity in Sn-Rich Alloy/Copper Joints by X-ray Tomography," Materials Characterization, vol. 62, Issue 10, pp. 970-975, 2011.

Li et al., "Lead-Free Solder Joint Void Evolution During Multiple Subsequent High-Temperature Reflows," IEEE Transactions on Device Materials Reliability, vol. 12, Issue 2, pp. 494-500, 2012.

Tian et al., "Quantitative X-ray Microtomography Study of 3-D Void Growth Induced by Electromigration in Eutectic SnPb Flip-Chip Solder Joints," Scripta Materialia, vol. 65, No. 7, pp. 646-649, 2011.

Tsuritani et al., "Nondestructive Evaluation of Thermal Phase Growth in Solder Ball Microjoints by Synchrotron Radiation X-Ray Microtomography," Journal of Electronic Packaging, vol. 129, Issue 4, pp. 434-439, 2007.

Yazzie et al., "Multiscale Microstructural Characterization of Sn-rich Alloys by Three Dimensional (3D) X-ray Synchrotron Tomography and Focused Ion Beam (FIB) Tomography," Materials Characterization, vol. 70, pp. 33-41, 2012.

Maleki et al., "Isothermal Ageing of SnAgCu Solder Alloys: Three-Dimensional Morphometry Analysis of Microstructural Evolution and Its Effects on Mechanical Response," Journal of Electronic Materials, vol. 43, Issue 4, pp. 1026-1042, 2014.

Bertheau et al., "Reflow Processes in Micro-Bumps Studied by Synchrotron X-ray Projection Nanotomography," Microelectronic Engineering, vol. 113, pp. 123-129, 2014.

Tsuritani et al., "Application of Synchrotron Radiation X-Ray Microtomography to Nondestructive Evaluation of Thermal Fatigue Process in Flip Chip Interconnects," Journal of Electronic Packaging, vol. 133, Issue 2, pp. 021007, 2011.

Yang et al., "Electromigration and Thermomigration Behavior of Flip Chip Solder Joints in High Current Density Packages," Journal of Material Research, vol. 23, No. 9, pp. 2333-2339, 2008.

Ye et al., "Deformation of Solder Joints Under Current Stressing and Numerical Simulation—I," International Journal of Solids and Structures, vol. 41, pp. 4939-4958, 2004.

Zhang et al., "Current-Induced Weakening of Sn3.5Ag0.7Cu Pb-Free Solder Joints," Scripta Materialia, vol. 56, pp. 381-384, 2007.

Yue et al., "Electromigration Induced Microstructure Evolution and Damage in Asymmetric Cu/Sn-58Bi/Cu Solder Interconnect Under Current Stressing," Transactions of Nonferrous Metals Society of China, vol. 24, pp. 1619-1628, 2014.

Du et al., "Effect of Electromigration on Interfacial Reactions in 90Sn-10SbPb-Free Solder Joints," Journal of Electronic Materials, vol. 38, No. 11, pp. 2398-2404, 2009.

Aubel et al., "Highly Accelerated Electromigration Lifetime Test (HALT) of Copper," IEEE Transactions on Device and Materals Reliability, vol. 3, No. 4, pp. 213-217, 2003.

Siewert et al., "Test Procedures for Developing Solder Data," National Institute of Standards and Technology (NIST) Special Publication, No. 960-8, 2002.

Mertens et al., "A Study of EM Failure in a Micro-Scale Pb-Free Solder Joint Using a Custom Lab-Scale X-ray Computed Tomography System," in Developments in X-ray Tomography IX, Proc. of SPIE, vol. 9212, pp. 92121E-1- 92121E-9, 2014.

Yin et al., "Size and Volume Effects on the Strength of Microscale Lead-Free Solder Joints," Journal of Electronic Materials, vol. 38, No. 10, pp. 2179-2183, 2009.

Wu et al., "A Comparative Investigation of the Electromigration Behavior Between Wedge-Type and Line-Type Cu/SN3.0Ag0.5Cu/Cu Interconnects," International Conference on Electronic Packaging Technology & High Density Packaging, pp. 971-975, 2011.

Dudek et al., "Three-Dimensional (3D) Microstructure Visualization of LaSn3 Intermetallics in a Novel Sn-rich Rare-Earth-Containing Solder," Materials Characterization, vol. 59, Issue 9, pp. 1364-1368, 2008.

Williams et al., "Damage Evolution in SiC Particle Reinforced Al Alloy Matrix Composites by X-ray Synchrotron Tomography," Acta Materialia, vol. 58, Issue 18, pp. 6194-6205, 2010.

Padilla et al., "Quantifying the Effect of Porosity on the Evolution of Deformation and Damage in Sn-based Solder Joints by X-ray Microtomography and Microstructure-based Finite Element Modeling," Acta Materialia, vol. 60, Issue 9, pp. 4017-4026, 2012.

Flynn et al., "Microfocus X-ray Sources for 3D Microtomography," Nuclear Instruments & Methods in Physics Reasearch Section A, vol. 353, Issue 1-3, pp. 312-315, 1994.

Feldkamp et al., "Practical Cone-Beam Algorithm," Journal of the Optical Society of America, vol. 1, No. 6, pp. 612-619, 1984.

Schena et al., "Detecting Microdiamonds in Kimberlite Drill-Hole Cores by Computed Tomography," International Journal of Mineral Processing, vol. 75, Issues 3-4, pp. 173-188, 2005.

Uhlmann et al., "Characterization and Comparison of Direct and Indirect Converting X-ray Detectors for Non-Destructive Testing (NDT) in Low-Energy and High-Resolution Applications," Nuclear Instruments and Methods in Physics Research Section A, vol. 591, Issue 1, pp. 46-49, 2008.

Koch et al., "X-ray Imaging with Submicrometer Resolution Employing Transparent Luminescent Screens," Journal of the Optical Society of America, vol. 15, No. 7, pp. 1940-1951, 1998.

Uesugi et al., "Comparison of Lens- and Fiber-Coupled CCD Detectors for X-ray Computed Tomography," Journal of Synchrotron Radiation, vol. 18, Issue 2, pp. 217-223, 2011.

Dierick et al., "The Use of 2D Pixel Detectors in Micro- and Nano-CT Applications," Nuclear Instruments and Methods in Physics Research Section A, vol. 591, Issue 1, pp. 255-259, 2008.

Packham, "Testing and Characterisation of Scintillator Materials for X-ray Detection," Master of Physics' Thesis, University of Surrey, Surrey, UK, 2010.

Schena et al., "Conceiving a High Resolution and Fast X-ray CT System for Imaging Fine Multi-Phase Mineral Particles and Retrieving Mineral Liberation Spectra," International Journal of Mineral Processing, vol. 84, Issues 1-4, pp. 327-336, 2007.

Mueller et al., "Anti-Aliased Three-Dimensional Cone-Beam Reconstruction of Low-Contrast Objects with Algebraic Methods," IEEE Transactions on Medical Imaging, vol. 18, No. 6, pp. 519-537, 1999.

Taylor et al., "Resolution, Artifacts and the Design of Computed Tomography Systems," Nuclear Instruments and Methods in Physics Research Section A, vol. 242, Issue 3, pp. 603-609, 1986.

Masschaele et al., "UGCT: New X-ray Radiography and Tomography Facility," Nuclear Instruments and Methods in Physics Research Section A, vol. 580, Issue 1, pp. 266-269, 2007.

Martin et al., "Recent Developments in X-ray Imaging with Micrometer Spatial Resolution," Journal of Synchrotron Radiation, vol. 13, Issue 2, pp. 180-194, 2006.

Sato et al., "Development of a High-Resolution X-ray Imaging System with a Charge-Coupled-Device Detector Coupled with Crystal X-ray Magnifiers," Review of Scientific Instruments, vol. 71, Issue 12, pp. 4449-4456, 2000.

Tous et al., "High-Resolution X-ray Imaging CCD Camera Based on a Thin Scintillator Screen," Radiation Measurements, vol. 42, Issues 4-5, pp. 925-928, 2007.

Graafsma et al., "Detectors for Synchrotron Tomography," Advanced Tomographic Methods in Materials Research and Engineering, Oxford Scholarship Online, pp. 227-302, 2008.

Aslund et al., "Detectors for the Future of X-ray Imaging," Radiation Protection Dosimetry, vol. 139, Nos. 1-3, pp. 327-333, 2010.

Valais et al., "Comparative Evaluation of Single Crystal Scintillators Under X-ray Imaging Conditions," Journal of Instrumentation, vol. 4, Issue 6, pp. P06013, 2009.

(56) References Cited

OTHER PUBLICATIONS

Williams et al., "On the Correlation Between Fatigue Striation Spacing and Crack Growth Rate: A Three-Dimensional (3-D) X-ray Synchrotron Tomography Study," Metallurgical and Materials Transactions A, vol. 42A, Issue 13, pp. 3845-3848, 2011.
Williams et al., Characterization of Damage Evolution in SiC Particle Reinforced Al Alloy Matrix Composites by In-Situ X-Ray Synchrotron Tomography, Metallurgical and Materials Transactions A, vol. 42A, Issue 10, pp. 2999-3005, 2011.
Stampanoni et al., "High Resolution X-ray Detector for Synchrotron-based Microtomography," Nuclear Instruments and Methods in Physics Research Section A, vol. 491, Issues 1-2, pp. 291-301, 2002.
Mertens et al., "Development of a Lab-Scale, High-Resolution, Tube-Generated X-ray Computed-Tomography System for Three-Dimensional (3D) Materials Characterization," Materials Characterization, vol. 92, pp. 36-48, Jun. 2014.
Pan et al., "Ring Artifact Removal for Micro-Tomography in Synchrotron Radiation," Physics of Medical Imaging, vol. 8313, pp. 831329, 2012.
Sadi et al., "Removal of Ring Artifacts in Computed Tomographic Imaging Using Iterative Center Weighted Median Filter," Computers in Biology & Medicine, vol. 40, Issue 1, pp. 109-118, 2010.
Anas et al., "Classification of Ring Artifacts for Their Effective Removal Using Type Adaptive Correction Schemes," Computers in Biology and Medicine, vol. 41, No. 6, pp. 390-401, 2011.
Lee et al., "Heat Effect and Impact Resistance during Electromigration on Cu—Sn Interconnections," Electronic Materials Letters, vol. 2, No. 3, pp. 157-160, 2006.
Burke et al., "Gamma-Induced Noise in CCDs," IEEE Transactions on Nuclear Science, Session C: Basic Mechanisms in Materials and Devices, vol. NS-28, No. 6, pp. 4067-4073, 1981.
Hardy et al., "Effects of Radiation Damage on Scientific Charge Coupled Devices," Advances in Imaging and Electron Physics, vol. 106, pp. 1-96, 1999.
Parish, "Development of Algorithms for on-Focal Plane Gamma Circumvention and Time Delay Integration," Materials, Devices, Techniques, and Applications for Z-Plane Array Technology II; Proc SPIE, vol. 1339, pp. 120-127, 1990.
Hopkinson, "Radiation Effects on Solid State Imaging Devices," Radiation Physics and Chemistry, vol. 43, Issues 1-2, pp. 79-91, 1994.
Bosiers et al., "Technical Challenges and Recent Progress in CCD Imagers," Nuclear Instruments and Methods in Physics Research A, vol. 565, pp. 148-156, 2006.
Marshall et al., "CCD Radiation Effects and Test Issues for Satellite Designers," NASA-GSFC Multi-Engineering Disciplinary Support Contract Task 1058, 2003.
Sijbers et al., "Reduction of Ring Artefacts in High Resolution Micro-CT Reconstructions," Physics in Medicine and Biology, vol. 49, Issue 14, pp. N247-N253, 2004.
Satyanarayan, "Reactive Wetting, Evolution of Interfacial and Bulk IMGs and Their Effect on Mechanical Properties of Eutectic Sn—Cu Solder Alloy," Advances in Colloid and Interface Science, vol. 166, pp. 87-118, 2011.
Mertens et al., "Note: Design and Construction of a Multi-Scale, High-Resolution, Tube-Generated X-ray Computed-Tomography System for Three-Dimensional (3D) Imaging," Review of Scientific Instruments, vol. 85, No. 1, pp. 016103, 2014.
Mertens et al., "A Study of Pb-Rich Dendrites in a Near-Eutectic 63Sn-37Pb Solder Microstructure via Laboratory-Scale Micro X-ray Computed Tomography (μXCT)," Journal of Electronic Materials, vol. 43, No. 12, pp. 4442-4456, 2014.
Kammer et al., "The Morphological Evolution of Dendritic Microstructures During Coarsening," Acta Materialia, vol. 54, Issue 6, pp. 1549-1558, 2006.
Sa et al., "The Effect of Solidification Variables on Tertiary Dendrite Arm Spacing in Unsteady-State Directional Solidification of Sn—Pb and Al—Cu Alloys," Materials Science and Engineering A, vol. 373, Issues 1-2, pp. 131-138, 2004.
Netto De Souza et al., "The Correlation Between Thermal Variables and Secondary Dendrite Arm Spacing During Solidification of Horizontal Cylinders of Sn—Pb Alloys," Journal of Alloys Compounds, vol. 399, Issues 1-2, pp. 110-117, 2005.
Xie et al., "Electromigration Damage Characterization in Sn-3.9Ag-0.7Cu and Sn-3.9Ag-0.7Cu-0.5Ce Solder Joints by Three-Dimensional X-ray Tomography and Scanning Electron Microscopy," Journal of Electronic Materials, vol. 43, No. 1, pp. 33-42, 2014.
Zhang et al., "Evaluation of Constant Voltage Testing for Electromigration Study," Reliability Physics Symposium (IRPS), 2013 IEEE International, pp. EM.3.1-EM.3.4., Apr. 2013.
Syed et al., "Flip Chip Bump Electromigration Reliability: A Comparison of Cu Pillar, High Pb, SnAg, and SnPb Bump Structures," IMAPS Device Packaging Conference, pp. 000166-000171, 2010.
Basaran et al., "Electromigration Time to Failure of SnAgCuNi Solder Joints," Journal of Applied Physics, vol. 106, pp. 013707, 2009.
Chen et al., "Electromigration and Thermomigration in Pb-Free Flip-Chip Solder Joints," Annual Review of Materials Research, vol. 40, pp. 531-555, 2010.
Gan et al., "Electromigration in Solder Joints and Solder Lines," JOM 54, No. 6, pp. 34-37, 2002.
Liang et al., "Blocking Hillock and Whisker Growth by Intermetallic Compound Formation in Sn-0.7Cu Flip Chip Solder Joints Under Electromigration," Journal of Applied Physics, vol. 107, pp. 093715, 2010.
Ke et al., "Analysis and Experimental Verification of the Competing Degradation Mechanisms for Solder Joints Under Electron Current Stressing," Acta Materialia, vol. 59, pp. 2462-2468, 2011.

* cited by examiner

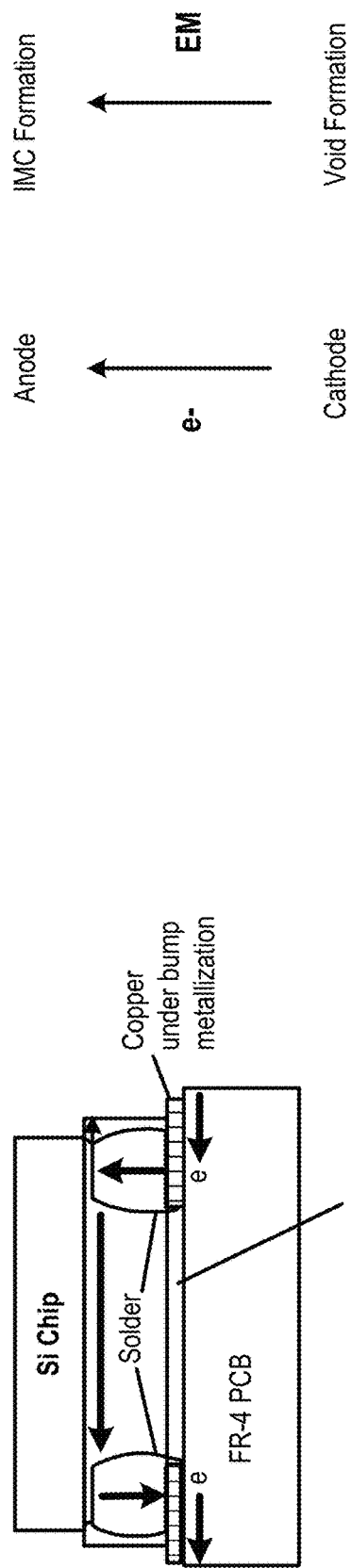
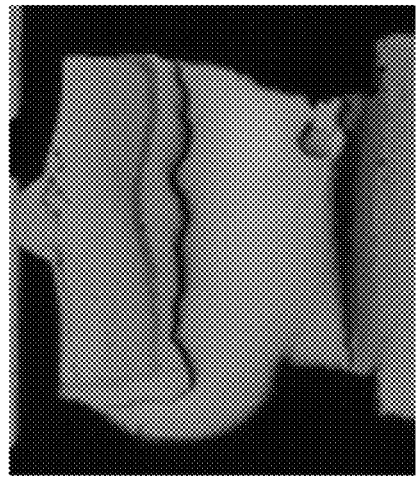
FIG. 2A
FIG. 2B
FIG. 2C

Pin 110 Detail

100

SYSTEMS AND METHODS FOR INTERCONNECT SIMULATION AND CHARACTERIZATION

CROSS-REFERENCE TO RELATED APPLICATIONS

This application claims priority to, and the benefit of, U.S. Provisional Application Ser. No. 62/261,965 filed on Dec. 2, 2015 and entitled "SYSTEMS AND METHODS FOR INTERCONNECT SIMULATION AND CHARACTERIZATION". This application is hereby incorporated by reference in its entirety for all purposes.

TECHNICAL FIELD

The present disclosure relates to microelectronics, and in particular to characterization of metallic interconnects in microelectronic devices.

BACKGROUND

In many electronic devices, electromigration affects interconnect electrical conductivity (for example, in microelectronics packaging (MEP) systems), causing a premature failure and impacting the performance of the component. Accordingly, improved systems and approaches for creation and characterization of interconnects remain desirable.

SUMMARY

In an exemplary embodiment, a method for electromigration testing comprises forming a first bump on a first copper pin, the first bump having a diameter of between about 30 microns and about 50 microns and a height of between about 30 microns and about 50 microns. The method further comprising forming a second bump on a second copper pin, the second bump having a diameter of between about 30 microns and about 50 microns and a height of between about 30 microns and about 50 microns. The method further comprises forming a joint between the first bump and the second bump with solder; fixing the first copper pin and second copper pin to a substrate; and applying current to the joint to evaluate electromigration in the joint.

In another exemplary embodiment, a system for electromigration testing comprises a first cartridge having a first copper pin coupled thereto. The first copper pin is configured with a first bump having a diameter of between about 30 microns and about 50 microns and a height of between about 30 microns and about 50 microns. The system further comprises a second cartridge having a second copper pin coupled thereto. The second copper pin is configured with a second bump having a diameter of between about 30 microns and about 50 microns and a height of between about 30 microns and about 50 microns. The system further comprises a fixed platform for receiving the first cartridge, a moveable platform for receiving the second cartridge and moving the first bump and the second bump into contact with one another, and a plurality of cameras for viewing alignment of the first bump and the second bump via operation of the moveable platform.

The contents of this summary section are to be understood as a simplified introduction to the disclosure, and are not intended to be used to limit the scope of any claim.

BRIEF DESCRIPTION OF THE DRAWINGS

With reference to the following description and accompanying drawings:

FIG. 2A illustrates current flow and electromigration in microelectronic interconnects;

FIG. 2B illustrates a scanning electron micrograph of a microelectronic interconnect subject to electromigration;

FIG. 2C illustrates formation of voids and intermetallic compounds due to electromigration;

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from principles of the present disclosure.

For the sake of brevity, conventional techniques for interconnect formation, testing, characterization, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical interconnect assessment system.

Figure 1:
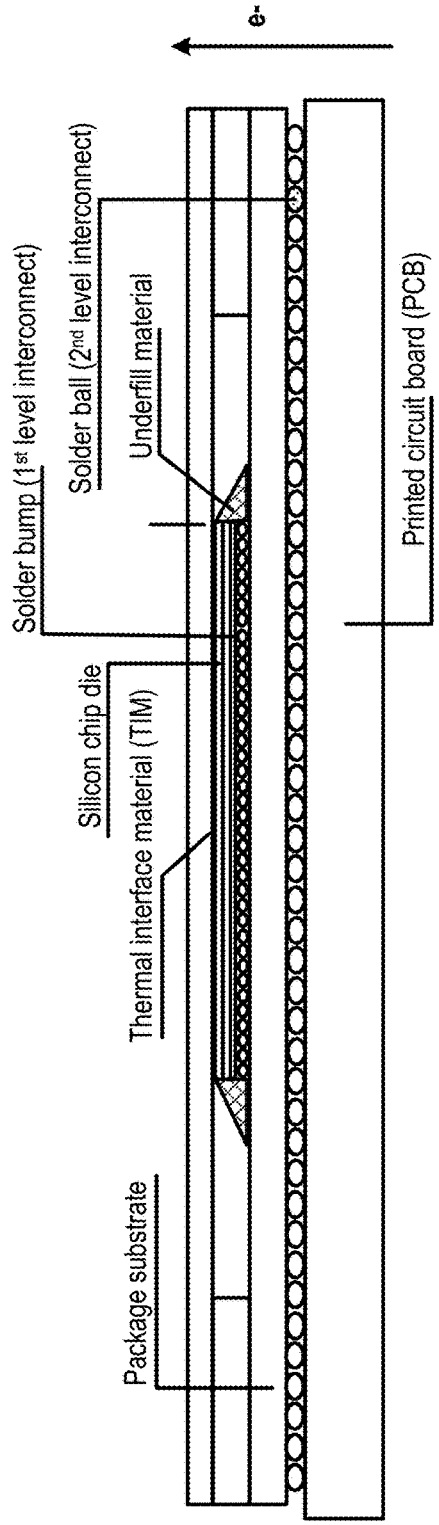
FIG. 1 illustrates a schematic representation of a typical microelectronic system and interconnects.
Figure 3A:
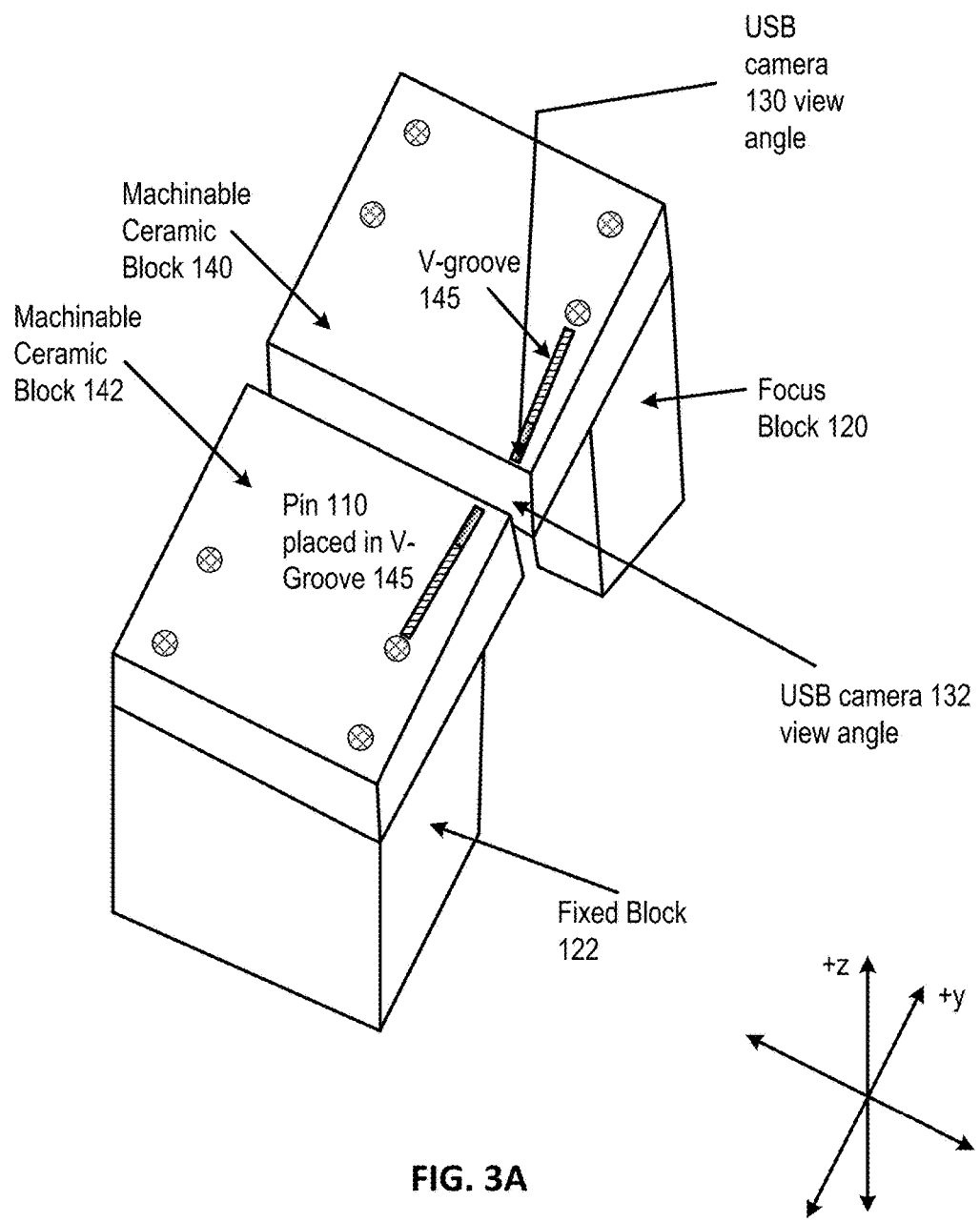
FIGS. 3A through 3C illustrate an exemplary device for formation and characterization of interconnects, and components thereof, in accordance with an exemplary embodiment.
Figure 3B:
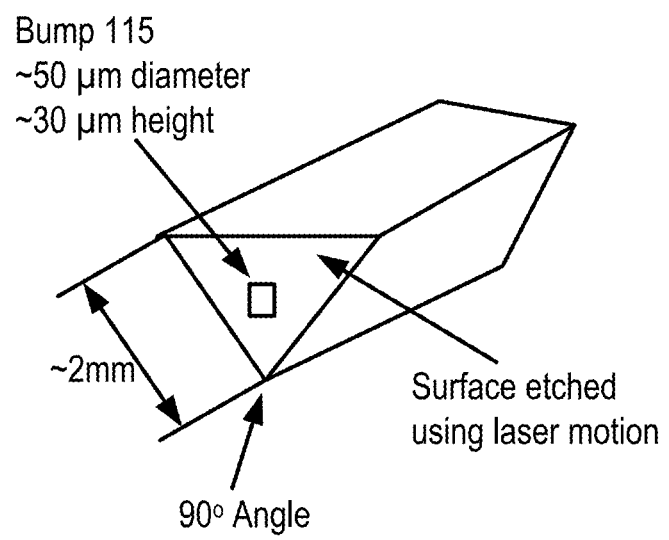
Figure 3C:
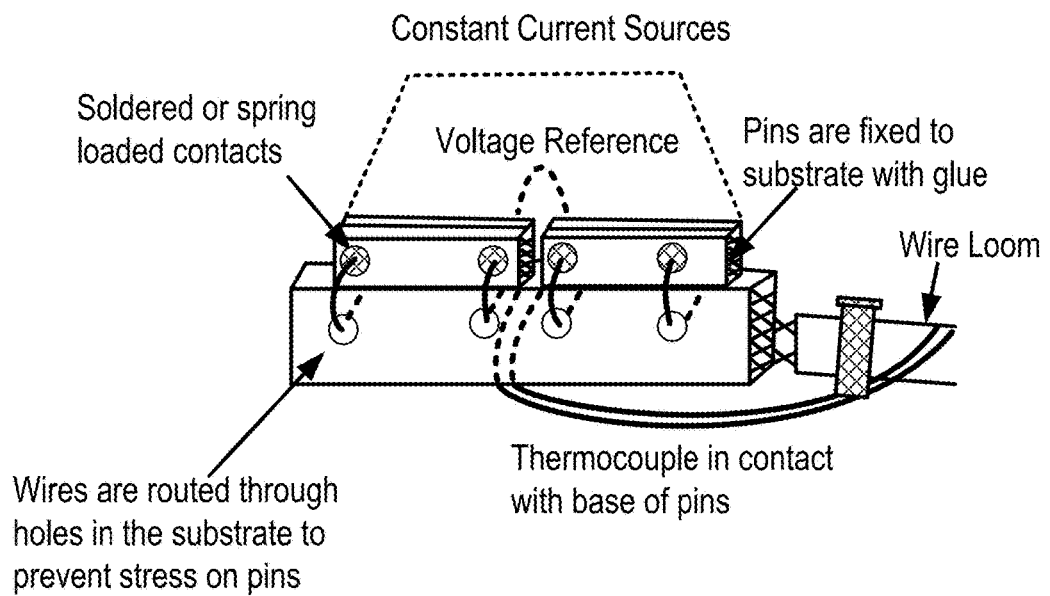

Electromigration (EM) is a phenomena present in conductors where high electron flux is present. This is sometimes referred to as "electron wind". The EM mechanism involves the mass transport of atoms driven by combined forces of electric field and charge carriers. There are two forces that are exerted on the atoms that cause the mass transport, which are (i) a Columbic force produced by the electric field and (ii) the force exhibited from the momentum transfer in the flow of carrier charges. In many electronic devices, electromigration affects interconnect electrical conductivity in a microelectronics packaging (MEP) system (for example, the $1^{st}$ and $2^{nd}$ level interconnects in flip chip ball grid array (FCBGA) system shown in FIG. 1), causing a premature failure and impacting the performance of the component.

At current densities above the threshold current (the necessary current density needed to initiate the movement of an atom), the electron wind becomes powerful enough to physically displace atoms in the material. After stressing for an extended time, atoms in interconnects accumulate on the anode end, resulting in void formation on the cathode side which can lead to open failure with time. In most electrical applications, current densities are not adequate to cause this to happen. However, with the continuous trend in the microelectronics industry requiring smaller and smaller devices and reduced form factors with larger functionality, new challenges in EM management have surfaced. Reduction in device and interconnect solder bump sizes has led to increased current density in these small solders, leading to higher EM. Higher EM occurring due to increased current density is of great concern, affecting the reliability of the entire microelectronics system. The increased current sustained by interconnects is becoming large enough to cause electromigration, resulting in severe denegation of the electrical connection and eventually rendering the chip inoperable. The specific causes in current solder arrays are associated with void formation and copper enrichment that leads to the formation of copper-tin intermetallic compounds (IMC) that are very poor conductors of electricity. These voids and intermetallic compounds generally form at the solder-copper interface; in DC circuits they generally tend to be on opposing sides of the connection (see FIGS. 2A through 2C).

Understanding and quantifying electromigration is critical to ensure product reliability. It is a common practice to evaluate EM characteristics of interconnects through software simulations and accelerated life testing (ALT). EM testing of small sub-micron features and interconnects has become very challenging, and industry is in dire need of an accurate, efficient, and cost effective EM testing methodology in support of fast-paced microelectronics technology requirements.

Accordingly, principles of the present disclosure improve on the current testing methods for electromigration. Currently, the most popular test is referred to as daisy chain testing. Daisy chain tests are carried out by fabricating a microelectronics system with a long sequence of series connections. An applied current passes through all of these connections and the effects of electromigration are multiplied over the whole of the circuit as a result. This results in creating a more easily measureable change in performance. Though widely used, this method has some shortcomings, the greatest of which is the cost of the test. During the analysis of the test, these MEP systems are cut and ground so that the connections can be imaged using scanning electron microscopy (SEM) or other suitable techniques. This approach, in conjunction with the cost of manufacturing the die and assembling the chip, makes the daisy chain approach excessively expensive. However, an even larger drawback of the daisy chain technique is the inability to truly measure what is happening real time with each individual connection.

With loading and joule heating, each connection will fluctuate in temperature and resistance. A testing capability to measure temperature and resistance real time and at individual interconnects is extremely valuable to better understand the mechanism of electromigration, and in evaluating new interconnect materials and product design. Such information is not available in daisy chain testing, due to the fact that daisy chain testing measures the overall average resistance along all interconnects in the path, and it nullifies the fluctuations that are not all happening simultaneously and in tune with one another.

A "V-groove" testing approach for EM analysis of individual solder interconnects utilizes preferred orientation etching of silicon to create very clean v-grooves, which are then metallized via CVD or another process, and the individual joint is created in the groove. This method provides more information about a single connection, but the size of the connection is generally an order of magnitude larger than the component connection for which the tests are intended, resulting in differences in microstructure between the test piece and that of the component. The size of today's typical interconnections is about 50 microns in diameter and about 30 microns thick. With reduction in solder bump size, the polycrystalline nature of the individual solder lends itself to few grains, eventually approaching that of bi- and/or single-crystal/grain morphology. The presence of an aligned grain boundary (and/or high-diffusion grain orientation, for example in anisotropic body centered tetragonal (BCT) tin-based solder) introduces an easier diffusion path, leading to increased propensity for electromigration and decreased solder joint integrity.

Moreover, when a large sample is tested, it is difficult to relate the results to a very small sample, because the large sample will most likely have enough grains in it and a tortuous grain boundary diffusion path to make it behave as if it were amorphous. Additionally, use of a large sample makes it hard to pinpoint which aspects of the process would need to be changed to improve performance. Accordingly, in both the daisy chain and the v-groove EM tests, there is a muddling of information that hinders understanding of what is occurring in the joint.

In contrast, principles of the present disclosure enable exemplary tests that replicate the joint size of current and future advance microelectronics systems, with capability for testing of a single joint. Additionally, exemplary systems and methods reduce cost and setup time, and provide for parallel testing.

In an exemplary embodiment, an exemplary system and related method enables: (i) employing a single joint; (ii) fabrication and testing of 50 micron or smaller joints in diameter; (iii) accurate, efficient, and cost-effective methods; and (iv) an opportunity for automation and large-scale implementation across factory/assembly processes.

In various exemplary embodiments, an interconnect assessment system 100 is configured to allow an interconnect to be formed and characterized. System 100 facilitates joining of two pins 110 having bumps 115 thereon; subsequently, testing and characterization of the interconnect formed at bumps 115 is simplified and improved.

In an exemplary embodiment, with reference now to FIGS. 3A through 8, copper pins 110 are fabricated such that they are large enough to handle, but with a very small integrated copper bump 115 on one of the ends. To form such pins 110, any suitable method may be utilized, but a preferred approach is to use a laser to etch away at the copper until a suitable island of copper is left, forming bump 115. In an exemplary embodiment, the profile of the copper pin 110 is about 1 mm squared, the end is polished to achieve a flat surface, and then it is etched with the laser until a 50 micron bump 115 is formed. An examination to determine suitability of the resulting pin 110/bump 115 structure can be performed as desired, for example using an optical microscope.

Precise alignment and control of the position of the pins 110 is desirable during assembly of the test piece. Because of this, principles of the present disclosure contemplate an exemplary system that can be used to align two copper pins 110 for soldering and assembly. In an exemplary embodiment, a three axis precision focus block 120 is attached to a blancher ground steel plate, and an aluminum fixed block 122 is machined to match the focus block 120 at medium height. V-shaped grooves are machined into a block of machinable glass-mica ceramic. The block is sawn in half and one half 140 is attached to the focus block 120, while the other half 142 is attached to the aluminum fixed block 122. USB microscope cameras 130, 132 are placed near the v-groove where the two ceramic blocks met. Camera 130 is placed normal to the surface of the ceramic blocks 140 and 142, and camera 132 is placed perpendicular to the first camera and pointing to the side of the solder joint. In this manner, the pins 110 can be aligned along both axes without having to change the camera perspective. See FIG. 3A. Focus block 120 may be coupled to various servos, platforms, actuators, control systems, and the like, in order to allow for controlled and precise movement of focus block 120 in three dimensions.

In an exemplary embodiment, after the copper pins 110 are finished, joint formation may be pursued. Two pins 110 are selected and placed in the ceramic v-grooves 145 with the bumps 115 facing inward towards each other. A desired amount of flux may be applied, for example via a silicon bristle or other suitable technique. The bristle end may be pressed against some flux to load it, and subsequently placed in the ceramic v-groove. The USB microscope cameras 130, 132 are used to align the droplet of flux on the bristle with the bump 115 on the pin 110, and the two are brought together until the face of the bump 115 is loaded with flux. This process is repeated for the second pin 110. Thereafter, the first bristle is exchanged for a second bristle; the second bristle bristle is lightly pressed against some solder balls, and the electrostatic forces acting on the second bristle are sufficient to adhere the solder balls to its surface.

The second bristle is aligned with the pin 110 and they are brought close together. Using the two USB microscope cameras 130, 132, a single ball is aligned with the droplet of flux that had been administered to the end of the pin 110. Lightly, the two are brought closer together until the flux adheres to the solder ball and removes it from the second bristle. At this point, the second pin 110 is returned to the v-groove 145 and brought together with the pin 110/solder ball assembly. Upon touching, the flux on the pin 110 adheres to the ball creating a connection between the two pins 110. Heat is applied until the solder becomes molten; the pins 110 expand on heating so adjustments in the z-axis may be made as desired to maintain the proper height. Once the solder makes adhesion with the two pins 110, the two pins 110 are separated slightly to test the sureness of the bond, and once the bond appears satisfactory the pins 110 are brought to the proper standoff height in the z direction. Heat is withdrawn, and while cooling the height is actively controlled to prevent separation as a result of thermal contraction. At this point, an exemplary joint has been created capable of conducting electricity; the exemplary joint is analogous to the joints that are used in real-world applications.

Figure 6:
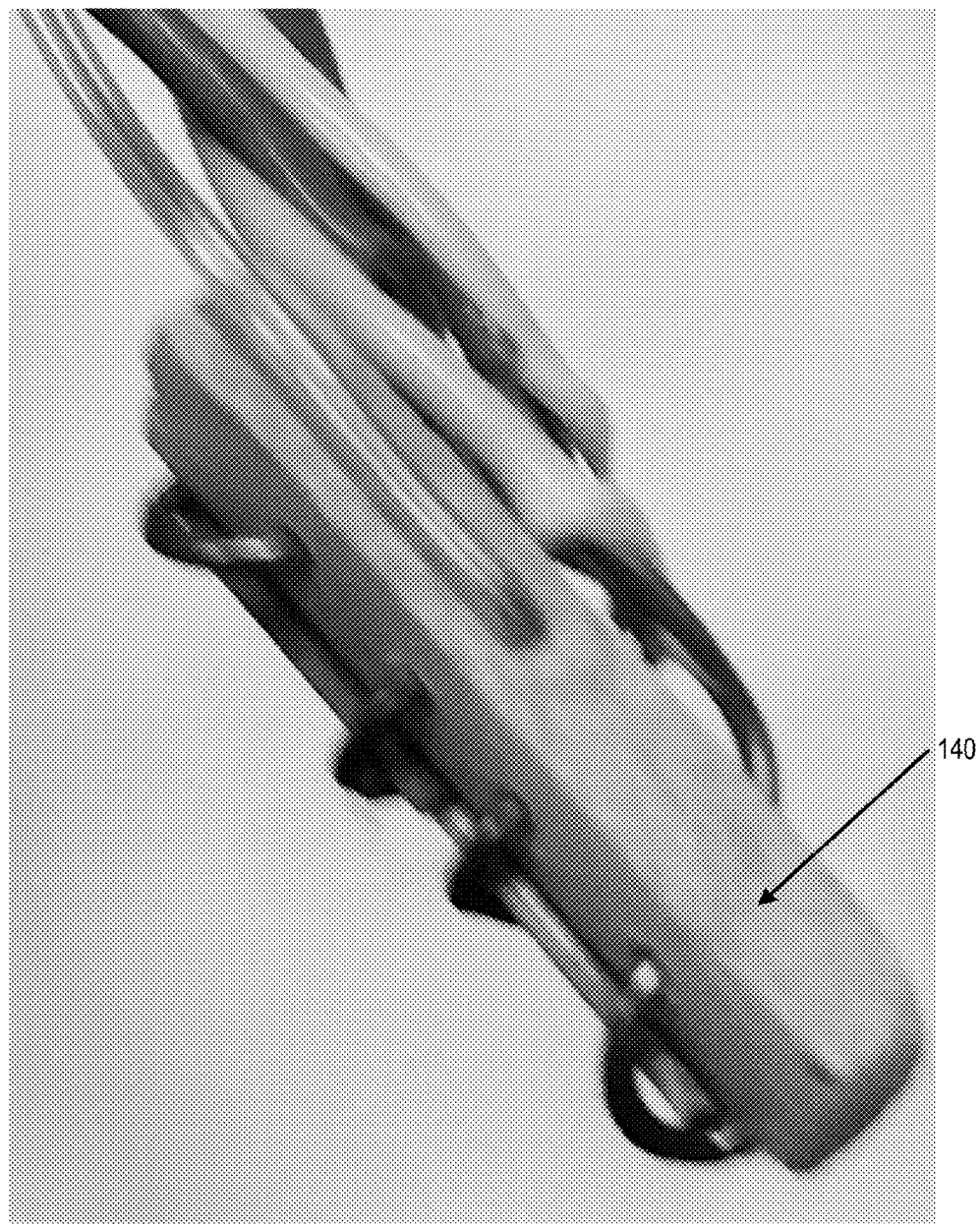
FIGS. 6 and 7 illustrate an exemplary assembly for characterization of a joint in accordance with an exemplary embodiment.
Figure 7:
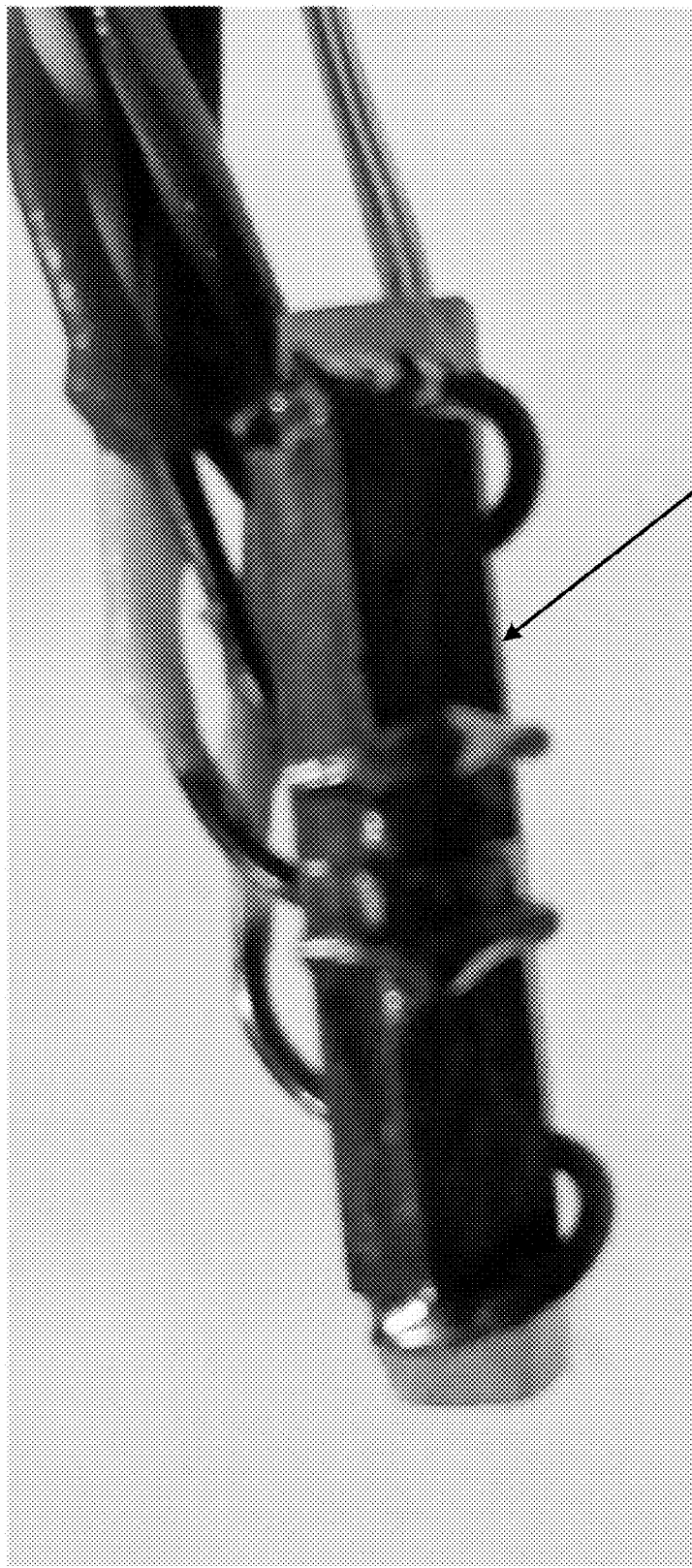

Once the exemplary joint has been created, principles of the present disclosure contemplate systems and methods for fixing the joint in a way so as to make it more usable and convenient. In various exemplary embodiments, for example, a ceramic substrate may be machined to support the joint. In a lower-cost approach, a substrate may be made out of soapstone by hand carving, for example by sanding a soapstone bar into rectangular bars with dimensions of about 2 mm×2 mm×10 mm. A quick and effective solution to mount the pins 110 is to first apply a drop of glue to the faces of the newly joined pins 110 and allow the glue to soak into the pins 110 and create a rigid structure. Glue may then be applied to the flat faces of the pins 110 and the substrate is applied and allowed to adhere as the glue sets up. This approach is simple and effective, resulting in a manageable joint that conducts electricity and is capable of four wire measurements. Further refinement may be achieved by using the soapstone to route the wires to their locations on the pins 110; additionally, a hole may be drilled in the soapstone to enable measurement of the temperature of the joint at a place very near the joint. Examples of this exemplary approach are shown in FIGS. 6 and 7.

Figure 5A:
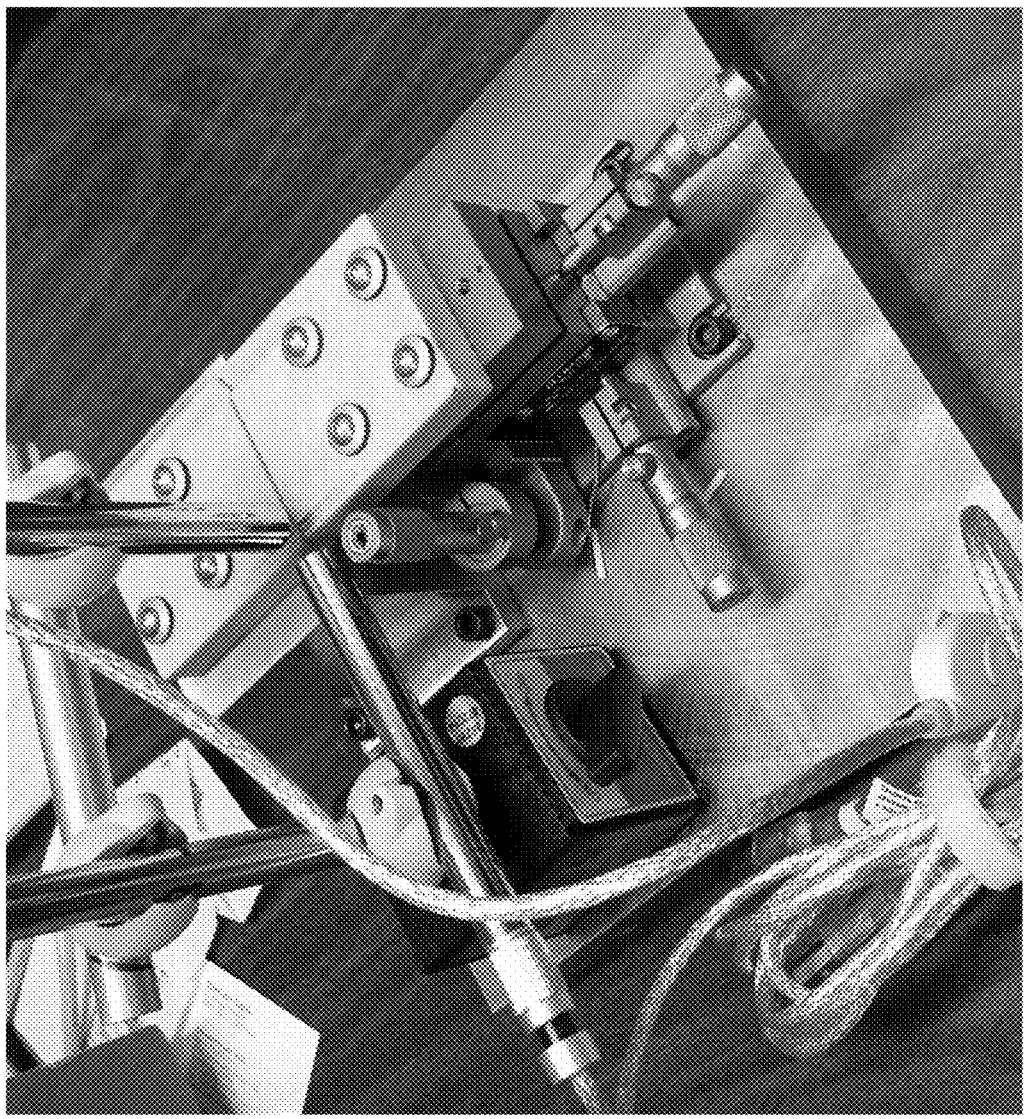
FIG. 5A illustrates an alignment assembly with cameras in accordance with an exemplary embodiment.
Figure 5B:
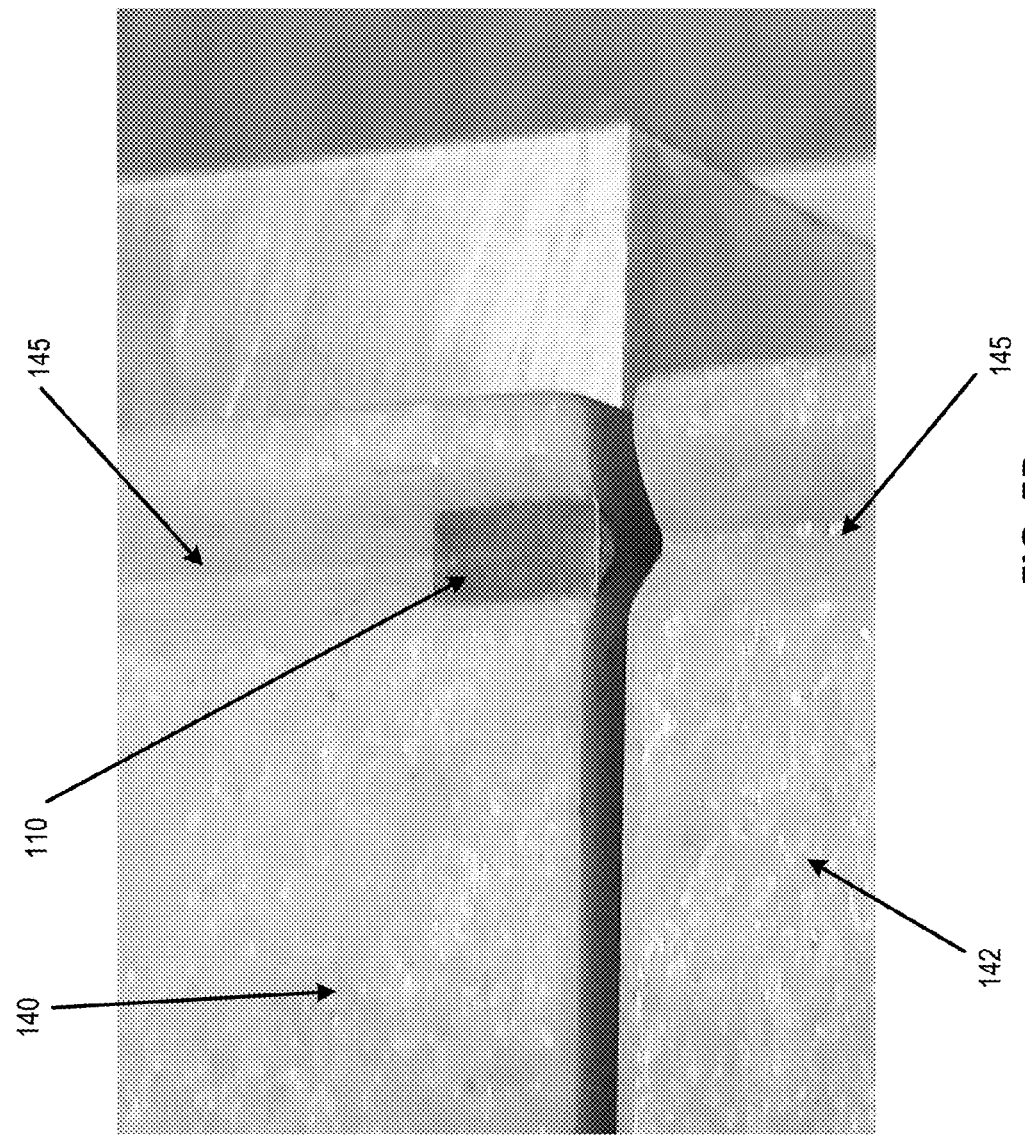
FIG. 5B illustrates a close-up of a V-groove with a pin inside in accordance with an exemplary embodiment.
Figure 8:
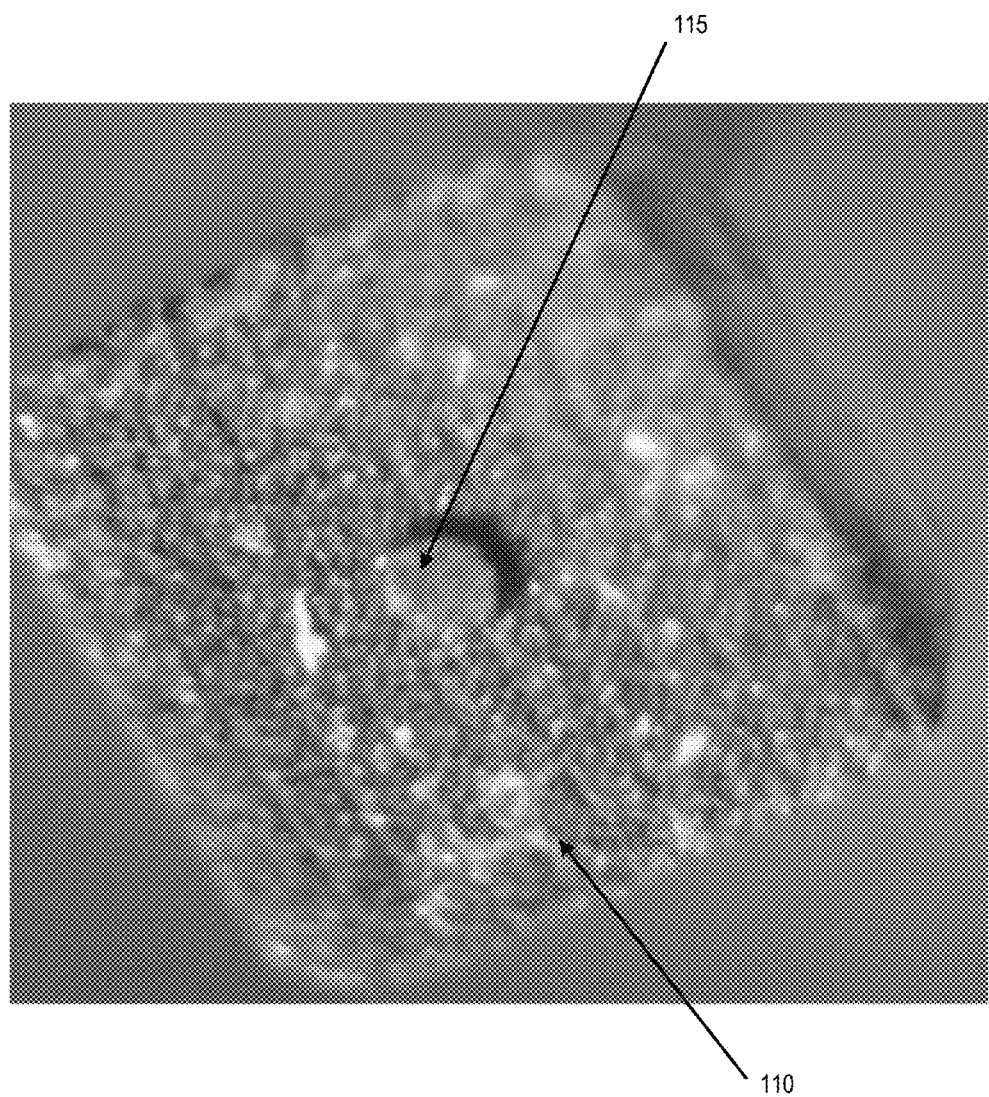
FIG. 8 illustrates an exemplary pin and bump for joint formation in accordance with an exemplary embodiment.

In accordance with various exemplary embodiments, FIG. 5A illustrates an exemplary system 100; FIG. 5B illustrates a close-up of a V-groove 145 with a pin 110 inside; and FIG. 8 illustrates the front surface of a pin 110 with the bump 115 showing (while the exemplary pin 110 illustrated in FIG. 8 is square and bump 115 is circular, any suitable pin 110 shape or bump 115 shape such as circular, triangular, rectangular, and/or the like may be utilized).

Figure 4A:
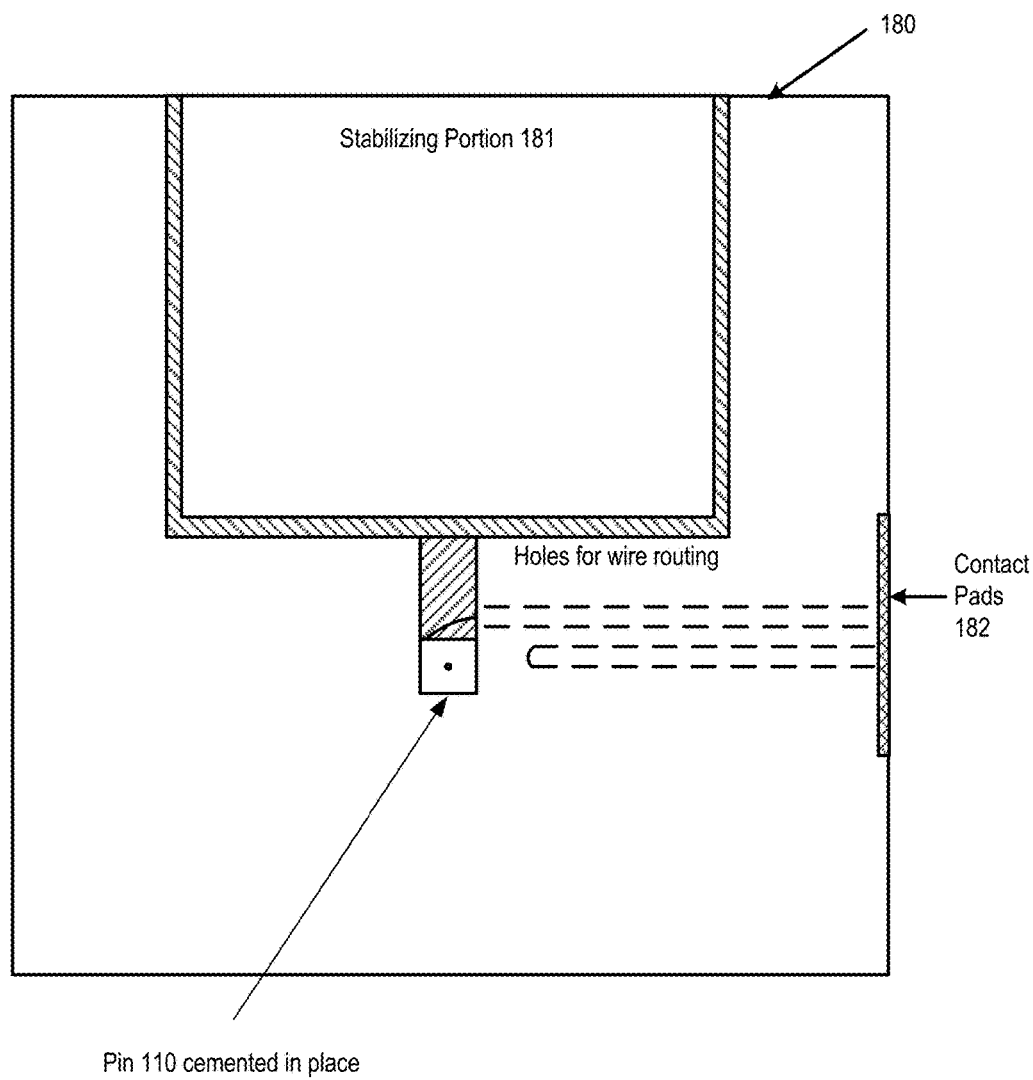
FIGS. 4A and 4B illustrate front and side views of a cartridge assembly suitable for use in an interconnect assessment system.
Figure 4B:
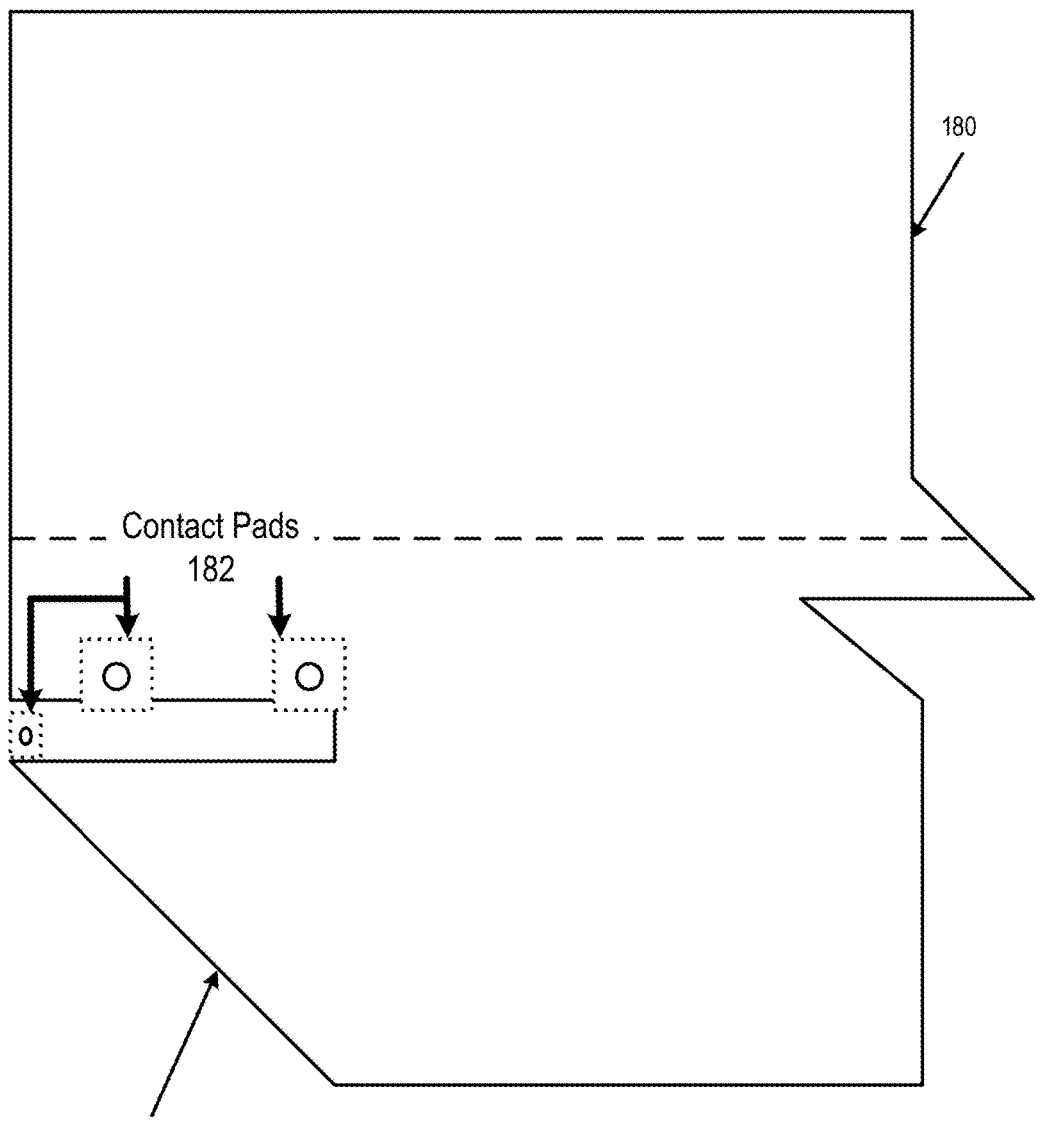

With reference now to FIGS. 4A and 4B, in various exemplary embodiments interconnect assessment system 100 may be configured to utilize a cartridge-like assembly 180 for aiding the creation and use of a testing piece. In contrast to other approaches where pins 110 are handled directly and a fixture is utilized to couple pins 110 together and adhere pins 110 to a substrate, in these exemplary embodiments pins 110 are aligned and attached in cartridges 180 which incorporate the desired electrical connections (for example, via internal wires, contact pads 182, and so forth), sensors, and the like.

As compared to other approaches, use of a cartridge-like assembly 180 allows for electrical connections to be made via any suitable process, for example soldering, laser, electron beam, ultrasonic, or other welding process. Moreover, a temperature sensor may be placed in closer proximity to the joint in order to obtain a more accurate temperature reading.

It will be appreciated that, once a first pin 110 in a first cartridge 180 is electrically coupled to a second pin 110 in a second cartridge 180, the first cartridge 180 and the second cartridge 180 may be coupled together, for example via a solid stabilizer portion 181 such as glue, epoxy, or the like, in order to fix the cartridges 180 with respect to one another.

Moreover, in these exemplary embodiments, use of cartridge 180 allows the ability to better predict the thermal expansion conditions that will occur; an identification on cartridge 180 may be provided in order to instruct system 100 as to how to handle cartridge 180 in order to ensure that minimal damage to the joint between first pin 110 and second pin 110 occurs during cooling.

As compared to other approaches, use of cartridge 180 allows for improved ease of sample preparation, improved automation of sample creation and testing, enhanced control over temperature during soldering of associated pins, and improved placement of sensors and electrical contact points associated with the pins.

Exemplary systems and methods disclosed herein provide for faster testing turnaround than current methods, and offer the convenience of parallel testing of many different configurations without adding significantly to the cost of the operation. Moreover, exemplary systems and methods are modular and can be adapted quickly for many different configurations. Additionally, principles of the present disclosure can save considerable time in the process of obtaining results from a test. A significant advantage comes from the disclosed ability to provide individual data for each joint while simultaneously maintaining the size of that joint to be consistent with the application joint size.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection. When language similar to "at least one of A, B, or C" or "at least one of A, B, and C" is used in the specification or claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method for electromigration testing, comprising:
   forming a first bump on a first copper pin, the first bump having a diameter of between about 30 microns and about 50 microns and a height of between about 30 microns and about 50 microns;
   forming a second bump on a second copper pin, the second bump having a diameter of between about 30 microns and about 50 microns and a height of between about 30 microns and about 50 microns;
   forming a joint between the first bump and the second bump with solder;
   fixing the first copper pin and second copper pin to a substrate; and
   applying current to the joint to evaluate electromigration in the joint.

2. The method of claim 1, wherein the first pin is disposed in a v-groove in the substrate.

3. The method of claim 2, wherein the second pin is disposed in a v-groove in the substrate.

4. The method of claim 1, wherein the first bump is formed via laser ablation of the first copper pin.

5. The method of claim 1, further comprising monitoring the temperature of the joint while the current is applied.

6. The method of claim 1, wherein the solder is an anisotropic body centered tetragonal (BCT) tin-based solder.

7. The method of claim 1, wherein, during the forming a joint, the first copper pin is coupled to a first block of material and the second copper pin is coupled to a second block of material.

8. The method of claim 7, wherein the second block of material is coupled to an actuator for moving the second block of material in three dimensions.

9. The method of claim 8, wherein the forming a joint comprises:
   applying flux to the first bump;
   applying solder to the second bump; and
   applying heat to the first bump, the second bump, and the solder to form the joint.

10. The method of claim 9, wherein the forming a joint further comprises:
    ceasing application of heat to the first bump, the second bump, and the solder;
    monitoring thermal expansion of at least one of the first pin, the second pin, the first bump, the second bump, or the joint; and
    translating, via the actuator, the second block of material in order to prevent damage to the joint as the joint cools.

11. The method of claim 1, wherein the applying current to the joint comprises applying a sufficient amount of current to cause at least one of: formation of intermetallic compounds in the joint, formation of voids in the joint; or movement of a portion of the joint with respect to the first bump or the second bump.

12. The method of claim 1, further comprising monitoring, via a plurality of cameras, alignment of the first bump and the second bump during the forming a joint between the first bump and the second bump.

13. The method of claim 12, wherein the plurality of cameras comprise a first camera and a second camera disposed perpendicular to one another such that the first bump and the second bump can be aligned along two axes without having to change the perspective of the first camera or the second camera.

14. The method of claim 7, further comprising, prior to the applying current to the joint, coupling the first block of material to the second block of material such that a rigid structure is formed thereby.

15. The method of claim 14, wherein the first block of material and the second block of material are coupled via a glue.

16. The method of claim 1, wherein the first bump is formed on an end surface of the first pin, the end surface having an area of about 1 square millimeter.

17. The method of claim 16, wherein, prior to the forming the first pump on the end surface of the first pin, the end surface of the first pin is polished to achieve a flat surface.

* * * * *